United States Patent
Kawaguchi et al.

(10) Patent No.: US 11,322,909 B2
(45) Date of Patent: May 3, 2022

(54) SEMICONDUCTOR LASER DEVICE

(71) Applicant: PANASONIC INTELLECTUAL PROPERTY MANAGEMENT CO., LTD., Osaka (JP)

(72) Inventors: Masao Kawaguchi, Kyoto (JP); Shinichi Takigawa, Osaka (JP); Nozomi Naka, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 183 days.

(21) Appl. No.: 16/319,696

(22) PCT Filed: Aug. 23, 2017

(86) PCT No.: PCT/JP2017/030033
§ 371 (c)(1),
(2) Date: Jan. 22, 2019

(87) PCT Pub. No.: WO2018/043229
PCT Pub. Date: Mar. 8, 2018

(65) Prior Publication Data
US 2021/0028598 A1    Jan. 28, 2021

(30) Foreign Application Priority Data

Aug. 30, 2016 (JP) .............................. JP2016-168185

(51) Int. Cl.
*H01S 5/042* (2006.01)
*H01S 5/22* (2006.01)

(52) U.S. Cl.
CPC ...... *H01S 5/04254* (2019.08); *H01S 5/04256* (2019.08); *H01S 5/2218* (2013.01)

(58) Field of Classification Search
CPC ............ H01S 5/04254; H01S 5/04256; H01S 5/2218; H01S 2301/18; H01S 5/2036; H01S 5/34333
See application file for complete search history.

(56) References Cited

U.S. PATENT DOCUMENTS

| | | | | |
|---|---|---|---|---|
| 4,797,891 A | * | 1/1989 | Uomi | ................... H01S 5/4031 372/46.01 |
| 5,042,046 A | | 8/1991 | Sagawa et al. | |

(Continued)

FOREIGN PATENT DOCUMENTS

| | | |
|---|---|---|
| JP | 01-161794 A | 6/1989 |
| JP | 02-231780 A | 9/1990 |

(Continued)

OTHER PUBLICATIONS

International Search Report and Written Opinion dated Oct. 31, 2017 in International Application No. PCT/JP2017/030033; with partial English translation.

*Primary Examiner* — Xinning (Tom) Niu
(74) *Attorney, Agent, or Firm* — McDermott Will & Emery LLP

(57) ABSTRACT

A semiconductor laser device includes: a first semiconductor layer of a first conductivity type; a light emitting layer formed above the first semiconductor layer; a second semiconductor layer of a second conductivity type formed above the light emitting layer; and an electrode formed above a ridge portion formed in the second semiconductor layer. The electrode is divided at positions at which an integrated value of light intensities of higher-order mode oscillation has a local maximum.

9 Claims, 6 Drawing Sheets

(56) References Cited

U.S. PATENT DOCUMENTS

| | | | | |
|---|---|---|---|---|
| 5,892,785 A | * | 4/1999 | Nagai | H01S 5/22 |
| | | | | 372/46.013 |
| 2005/0224783 A1 | * | 10/2005 | Matsuyama | B82Y 20/00 |
| | | | | 257/14 |
| 2007/0158637 A1 | * | 7/2007 | Tanaka | H01S 5/34333 |
| | | | | 257/12 |
| 2009/0034573 A1 | | 2/2009 | Takayama et al. | |

FOREIGN PATENT DOCUMENTS

| | | |
|---|---|---|
| JP | 2004-221385 A | 8/2004 |
| JP | 2009-033009 A | 2/2009 |

* cited by examiner

SEMICONDUCTOR LASER DEVICE

CROSS-REFERENCE OF RELATED APPLICATIONS

This application is the U.S. National Phase under 35 U.S.C. § 371 of International Patent Application No. PCT/JP2017/030033, filed on Aug. 23, 2017, which in turn claims the benefit of Japanese Application No. 2016-168185, filed on Aug. 30, 2016, the entire disclosures of which Applications are incorporated by reference herein.

TECHNICAL FIELD

The present disclosure relates to semiconductor laser devices and, in particular, to a semiconductor laser device used for laser machining.

BACKGROUND ART

Laser machining utilizes high energy obtained by condensing laser beams to an extremely small area to cut or weld materials by heating, melting, evaporating the materials.

Laser machining devices have been in practical use, which use a gas laser in the 10 µm band, such as CO2 laser, a solid-state laser such as YAG laser, or a fiber laser. In recent years, attention has been focused on direct diode lasers (DDL).

Although a YAG laser and a fiber laser uses a semiconductor laser as a source of excitation, when a semiconductor laser is used for a laser machining device, a laser beam used for laser machining is emitted from a solid-state crystal material (Nd:YAG) or a fiber amplifier. In contrast, in a laser beam machining device using DDL, a laser beam emitted from a semiconductor laser itself is uses for laser machining.

Due to a less complicated optical system of DDL than other lasers for machining, not only miniaturization and low cost are achieved, but also the semiconductor laser has an oscillation wavelength from ultraviolet to infrared. Thus, an optimal wavelength for various types of laser machining can be selected.

In general, the optical absorption rate of a material increases as the wavelength decreases. For instance, aluminum has an optical absorption peak in the 0.8 µm band, and the optical absorption rate in the 0.8 µm band is twice as much as the optical absorption rate in the 1 µm band. For copper and gold, the optical absorption rate increases around 0.6 µm, and the optical absorption rate in the 0.4 µm band is 10 times as high as the optical absorption rate in the 1 µm band. This shows that machining can be performed with less laser energy by using a laser beam with a short wavelength, which is desirable from the viewpoint of energy saving. Thus, attention is focused on DDL that uses a gallium arsenide (GaAs) based semiconductor laser in a laser machining device for aluminum machining. Also, attention is focused on DDL that uses a gallium nitride (GaN) based semiconductor laser in a laser beam machining device for machining copper and gold.

Meanwhile, in the DDL, the laser beam of a semiconductor laser is directly used for machining, thus the quality of machining depends on the quality of the laser beam. The beam quality of a semiconductor laser is numerically expressed in terms of beam parameter product (BPP). The BPP is defined as the product of divergence half-angle (radius) at the beam waist and beam spot radius (half width at half maximum of the divergence angle of beam). A smaller value of BPP indicates a higher beam quality of a laser beam. Therefore, it is easier to handle a semiconductor laser having a smaller value of BPP in laser machining.

The BPP of a semiconductor laser is represented by (Expression 1) using parameter $M^2$ which indicates a degree of deviation from a Gaussian beam. In (Expression 1), λ indicates an oscillation wavelength of the semiconductor laser.

$$BPP = M^2 \times \lambda / \pi \qquad \text{(Expression 1)}$$

In a semiconductor laser, when the transverse mode is a fundamental mode, $M^2$ takes a minimum value (approximately 1), and when the transverse mode is a higher-order mode, $M^2$ takes a large value (approximately 5 to 10). Therefore, in order to improve the BPP (to reduce the BPP), it is desirable that the semiconductor laser be oscillated in the fundamental transverse mode.

In general, the transverse mode of a semiconductor laser can be divided into a component along the fast axis perpendicular to an epitaxial layer and a component along the slow axis parallel to the epitaxial layer. The BPP can be determined by the square root of the sum of squares of the BPP component in the fast axis direction and the BPP component in the slow axis direction.

Almost all semiconductor lasers obtain an optical gain by condensing electrons/positive holes and light to an active layer to perform stimulated emission using a so-called double heterostructure. The thickness of the active layer is less than or equal to a higher-order mode cutoff thickness, thus the fundamental transverse mode oscillation occurs in the fast axis direction, and $M^2$ is approximately 1. On the other hand, in the slow axis direction, light confinement is performed by creating a structure such as a ridge waveguide.

A semiconductor laser for optical disc has a relatively small optical output (for instance, less than 1 W), and a single spot is required, thus the fundamental transverse mode oscillation is essential. For this reason, in a semiconductor laser for optical disc, the ridge width of a ridge stripe is approximately several µm.

For instance, PTL 1 discloses a semiconductor laser device for optical disc having a ridge stripe structure. The semiconductor laser device disclosed in PTL 1 achieves a stable fundamental transverse mode oscillation by forming a variation area in which the ridge width of a ridge stripe varies.

CITATION LIST

Patent Literature

PTL 1: Japanese Unexamined Patent Application Publication No. 2009-033009

SUMMARY OF THE INVENTION

Technical Problem

However, a semiconductor laser for laser machining has a high optical output in the order of Watt (for instance, 1 W or higher), and thus catastrophic optical damage (COD) may occur at an emission end face for the laser beam.

Thus, in order to prevent occurrence of COD, a high-output semiconductor laser for laser machining adopts a wide stripe structure which has, for instance, a 10 µm or longer ridge width (emitter width) of the ridge stripe.

In a semiconductor laser having the wide stripe structure, oscillation occurs not only when the transverse mode of the slow axis is the fundamental mode, but also when the transverse mode of the slow axis is a higher-order mode, thus a problem arises in that $M^2$ of the slow axis is increased, and the BPP degrades.

It is an object of the present disclosure to provide a semiconductor laser device which has high beam quality and high output and is capable of achieving fundamental transverse mode oscillation with an excellent BPP even in a wide stripe structure.

Solutions to Problem

In order to achieve the above-mentioned object, a first semiconductor laser device according to an aspect of the present disclosure includes: a first semiconductor layer of a first conductivity type; a light emitting layer formed above the first semiconductor layer; a second semiconductor layer of a second conductivity type formed above the light emitting layer; and an electrode formed above a ridge portion formed in the second semiconductor layer, wherein the electrode is divided at positions at which an integrated value of light intensities of higher-order mode oscillation has a local maximum.

This structure makes it possible to decrease the ratio of the current which flows through a portion where higher-order mode oscillation is integrated and the light intensity is high, and to increase the ratio of the current which flows through a portion where higher-order mode oscillation is integrated and the light intensity is low. Thus, the gain of the fundamental mode can be relatively larger than the gain of a higher-order mode, thus the fundamental mode oscillation is achieved. Consequently, a semiconductor laser device can be implemented, which has high beam quality and high output and is capable of achieving fundamental transverse mode oscillation with an excellent BPP even in a wide stripe structure.

In addition, in a first semiconductor laser device according to an aspect of the present disclosure, preferably, the electrode divided includes a plurality of electrode sections that extend in a stripe direction of the ridge portion, and a center of at least one of the plurality of electrode sections in a direction perpendicular to the stripe direction of the ridge portion is located at a position at which the integrated value of light intensities of higher-order mode oscillation has a local minimum.

This structure makes it possible to effectively increase the ratio of the current which flows through a portion where higher-order mode oscillation is integrated and the light intensity is the lowest, and to effectively decrease the ratio of the current which flows through a portion where higher-order mode oscillation is integrated and the light intensity is high. This enables the gain of higher-order mode to be effectively decreased, and thus stable fundamental transverse mode oscillation can be achieved.

In addition, in a first semiconductor laser device according to an aspect of the present disclosure, preferably, the electrode is divided at positions at which the integrated value of light intensities of higher-order mode oscillation has a local maximum, the positions including any position at which the integrated value has a corresponding local maximum.

This structure allows a current necessary to obtain a high gain in a higher-order mode to be 0 in all areas where the light intensity of the higher-order mode oscillation has a local maximum. This enables the gain of the higher-order mode to be effectively decreased, and a gain difference in the higher-order mode from the gain in the fundamental mode can be the largest. Thus, the fundamental transverse mode is more likely to be selected, and the fundamental transverse mode oscillation can be easily achieved.

In addition, in a first semiconductor laser device according to an aspect of the present disclosure, preferably, the electrode divided includes a plurality of electrode sections that extend in a stripe direction of the ridge portion, and a center of each of the plurality of electrode sections in a direction perpendicular to the stripe direction is located at a position at which the integrated value of light intensities of higher-order mode oscillation has a local minimum.

This structure makes it possible to most effectively increase the ratio of the current which flows through a portion where higher-order mode oscillation is integrated and the light intensity is the lowest, and to decrease most the ratio of the current which flows through a portion where higher-order mode oscillation is integrated and the light intensity is high. This enables the gain of higher-order mode to be most effectively decreased, and thus more stable fundamental transverse mode oscillation can be achieved.

In addition, a second semiconductor laser device according to an aspect of the present disclosure includes: a first semiconductor layer of a first conductivity type; a light emitting layer formed above the first semiconductor layer; a second semiconductor layer of a second conductivity type formed above the light emitting layer; an electrode formed above a ridge portion formed in the second semiconductor layer; and a current block layer formed between the light emitting layer and the electrode. The current block layer is divided into a plurality of current block sections that extend in a stripe direction of the ridge portion, and the plurality of current block sections are located at positions at which an integrated value of light intensities of higher-order mode oscillation has a local maximum.

This structure makes it possible to decrease the ratio of the current which flows through a portion where higher-order mode oscillation is integrated and the light intensity is high, and to increase the ratio of the current which flows through a portion where higher-order mode oscillation is integrated and the light intensity is low. Thus, the gain of the fundamental mode can be relatively larger than the gain of a higher-order mode, thus the fundamental mode oscillation is achieved. Consequently, a semiconductor laser device can be implemented, which has high beam quality and high output and is capable of achieving fundamental transverse mode oscillation with an excellent BPP even in a wide stripe structure.

In addition, in a second semiconductor laser device according to an aspect of the present disclosure, preferably, the current block layer is divided at positions at which the integrated value of light intensities of higher-order mode oscillation has a local minimum.

This structure makes it possible to effectively increase the ratio of the current which flows through a portion where higher-order mode oscillation is integrated and the light intensity is the lowest, and to effectively decrease the ratio of the current which flows through a portion where higher-order mode oscillation is integrated and the light intensity is high. This enables the gain of higher-order mode to be effectively decreased, and thus stable fundamental transverse mode oscillation can be achieved.

In addition, in a second semiconductor laser device according to an aspect of the present disclosure, preferably, each of the plurality of current block sections is located at a position at which the integrated value of light intensities of higher-order mode oscillation has a local maximum.

This structure allows a current necessary to obtain a high gain in a higher-order mode to be 0 in all areas where the light intensity of the higher-order mode oscillation has a local maximum. This enables the gain of the higher-order mode to be effectively decreased, and a gain difference in the higher-order mode from the gain in the fundamental mode can be the largest. Thus, the fundamental transverse mode is more likely to be selected, and the fundamental transverse mode oscillation can be easily achieved.

In addition, in a second semiconductor laser device according to an aspect of the present disclosure, preferably, the current block layer is divided at positions at which the integrated value of light intensities of higher-order mode oscillation has a local minimum, the positions including any position at which the integrated value has a corresponding local minimum.

This structure makes it possible to most effectively increase the ratio of the current which flows through a portion where higher-order mode oscillation is integrated and the light intensity is the lowest, and to decrease most the ratio of the current which flows through a portion where higher-order mode oscillation is integrated and the light intensity is high. This enables the gain of higher-order mode to be most effectively decreased, and thus more stable fundamental transverse mode oscillation can be achieved.

In addition, a third semiconductor laser device according to an aspect of the present disclosure includes: a first semiconductor layer of a first conductivity type; a light emitting layer formed above the first semiconductor layer; a second semiconductor layer of a second conductivity type formed above the light emitting layer; and an electrode formed above the second semiconductor layer. A current, which flows from the electrode into the light emitting layer, has a small value at a position at which an integrated value of light intensities of higher-order mode oscillation has a local maximum, and has a large value at a position at which the integrated value has a local minimum.

This structure makes it possible to decrease the ratio of the current which flows through a portion where higher-order mode oscillation is integrated and the light intensity is high, and to increase the ratio of the current which flows through a portion where higher-order mode oscillation is integrated and the light intensity is low. Thus, the gain of the fundamental mode can be relatively larger than the gain of a higher-order mode, thus the fundamental mode oscillation is achieved. Consequently, a semiconductor laser device can be implemented, which has high beam quality and high output and is capable of achieving fundamental transverse mode oscillation with an excellent BPP even in a wide stripe structure.

Advantageous Effects of Invention

A semiconductor laser device can be implemented, which has high beam quality and high output and is capable of achieving fundamental transverse mode oscillation with an excellent BPP even in a wide stripe structure.

DESCRIPTION OF EXEMPLARY EMBODIMENTS

Figure 1:
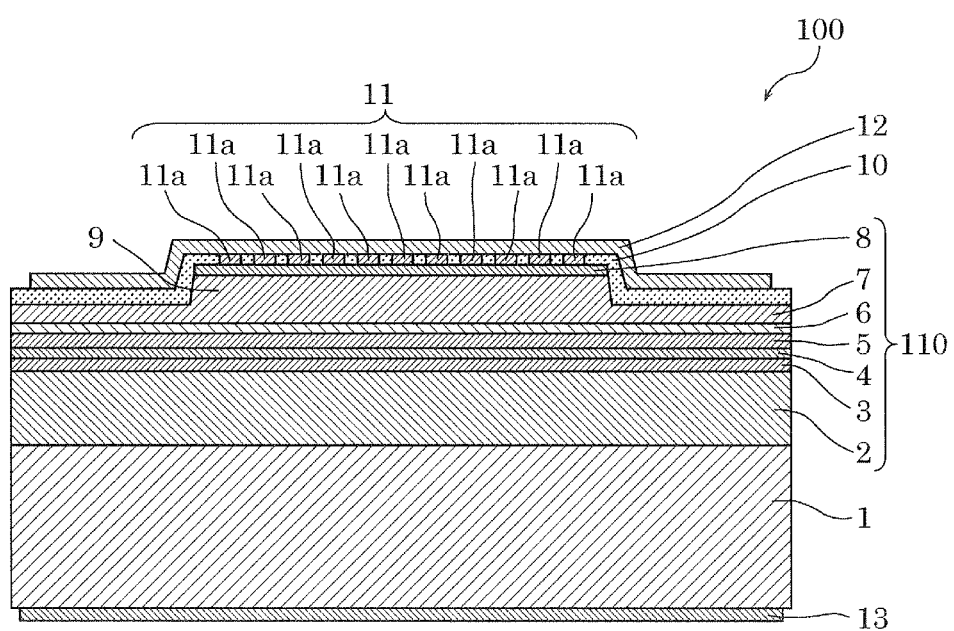
FIG. 1 is a cross-sectional view of a semiconductor laser device according to Embodiment 1.

Hereinafter, an embodiment of the present disclosure will be described with reference to the drawings. It should be noted that the subsequently-described embodiment shows a specific preferred example of the present disclosure. Therefore, the numerical values, shapes, materials, structural components, the arrangement and connection of the structural components, steps, the sequence of the steps shown in the following embodiments are mere examples, and are not intended to limit the scope of the present disclosure. Therefore, among the structural components in the subsequent embodiments, components not recited in any one of the independent claims that indicate the most generic concept of the present disclosure are described as arbitrary structural components.

It should be noted that the figures are each a schematic diagram and are not necessarily precise illustrations. Therefore, the scales used in the figures are not necessarily the same. In the drawings, essentially the same components are labeled with the same symbol, and a redundant description is omitted or simplified.

Embodiment 1

(Configuration of Semiconductor Laser Device)

First, the configuration of semiconductor laser device 100 according to Embodiment 1 will be described with reference to FIG. 1. FIG. 1 is a cross-sectional view of semiconductor laser device 100 according to Embodiment 1.

As illustrated in FIG. 1, semiconductor laser device 100 has semiconductor layer 110 in a layered structure, in which first cladding layer 2 (first semiconductor layer) of first conductivity type made of n-AlGaN, first guide layer (n-side guide layer) 3 made of undoped GaN, active layer 4 (light emitting layer) made of undoped InGaN in a multiple quantum well structure, second guide layer 5 (p-side guide layer) made of undoped GaN, electron overflow reduction layer 6 of second conductivity type made of p-AlGaN, cladding layer 7 (second semiconductor layer) of second conductivity type made of p-AlGaN, and contact layer 8 of second conductivity type made of p-GaN are sequentially formed on substrate 1 which is a GaN substrate. In the embodiment, first conductivity type is n-type and second conductivity type is p-type.

At a central portion of semiconductor laser device 100, elongated protruding ridge portion (ridge stripe) 9 extending in a laser resonator length direction is formed. In other words, the stripe direction (longitudinal direction) of ridge portion 9 is the laser resonator length direction. Ridge portion 9 is formed in second cladding layer 7, and constitutes the main optical waveguide of semiconductor layer 110. The width (ridge width) of ridge portion 9 is, for instance, 15 μm, but this is not always the case. Contact layer 8 is formed on the upper surface of ridge portion 9 of second cladding layer 7.

Semiconductor laser device 100 has p-side electrode 11 (first electrode) formed on ridge portion 9. In the embodiment, p-side electrode 11 is formed on the upper surface of contact layer 8 formed on ridge portion 9.

P-side electrode 11 is divided into multiple sections. Thus divided p-side electrode 11 includes multiple electrode sections 11a which extend in the stripe direction of ridge portion 9. In the embodiment, p-side electrode 11 is divided into 11 sections, and includes 11 electrode sections 11a.

As described later, p-side electrode 11 is divided into multiple sections at the positions at which an integrated value of the light intensities of the higher-order mode oscillation has a local maximum. Thus, the center of at least one of multiple electrode sections 11a in a direction perpendicular to the stripe direction of ridge portion 9 is located at a position at which an integrated value of the light intensities of the higher-order mode oscillation has a local minimum.

In the embodiment, p-side electrode 11 is divided into multiple sections at all positions at which an integrated value of the light intensities of the higher-order mode oscillation has a local maximum. In other words, the center of each of all multiple electrode sections 11a in a direction perpendicular to the stripe direction of ridge portion 9 is located at a position at which an integrated value of the light intensities of the higher-order mode oscillation has a local minimum.

For instance, the width of each electrode section 11a included in p-side electrode 11 is 0.7 μm, and the width between two adjacent electrode sections 11a is 0.5 μm. Each electrode section 11a extends from one end to the other end with the same width in the stripe direction of ridge portion 9.

The upper surface of semiconductor layer 110 excluding p-side electrode 11 is covered with insulating film 10 made of $SiO_2$. Specifically, insulating film 10 is formed to cover a portion of the upper surface of contact layer 8, the portion not including electrode sections 11a of p-side electrode 11. Hence, p-side electrode 11 (electrode sections 11a) is formed so as to be exposed from insulating film 10.

In the embodiment, p-side electrode 11 and insulating film 10 are flush with each other and have the same thickness, but this is not always the case. It should be noted that insulating film 10 is formed to also cover the portion (flat portion), other than ridge portion 9, of second cladding layer 7.

Pad electrode 12 is formed on p-side electrode 11 and insulating film 10. Pad electrode 12 is in contact with p-side electrode 11. N-side electrode 13 (second electrode) is formed on the back surface of substrate 1.

An end face coating film is formed at the front end face (light emitting face) of semiconductor laser device 100. An end face coating film on the front end face side is composed of $SiO_2$, which has a refractive index of 1.47 and is formed with an optical length of λ/4 (=405 nm/4/1.47=68.9 nm). The reflectance of the end face coating film is approximately 0.6%. In other words, the end face coating film on the front end face side is a low reflective film. Thus, the front end face has a low reflectance, and a high-output laser beam is obtained.

In addition, the end face coating film is also formed at the back end face (light reflective face) of semiconductor laser device 100. After $SiO_2$ having a refractive index of 1.47 is formed with an optical length of λ/4 (=405 nm/4/1.47=68.9 nm), the end face coating film on the back end face side is formed by alternately stacking a $ZrO_2$ layer and a $SiO_2$ layer in seven layers like $ZrO_2$ layer→$SiO_2$ layer→$ZrO_2$ layer→ . . . →$SiO_2$ layer→$ZrO_2$ layer in a periodic manner. The optical length of each of the seven layers is λ/4. For instance, the refractive index of $ZrO_2$ is 2.27, thus the thickness of the $ZrO_2$ layer is 405 nm/4/2.27=44.6 nm. Hence, the reflectance on the end face side can be approximately 95.3%.

The oscillation wavelength of a laser beam of thus formed semiconductor laser device 100 is, for instance, 405 nm. The effective refractive index felt by light waveguided by semiconductor laser device 100 is determined by the thickness and material composition of each layer. In the embodiment, the effective refractive index inside ridge portion 9 is 2.53, and the effective refractive index outside ridge portion 9 is 2.525. The resonator length of semiconductor laser device 100 is 1000 μm, for instance.

Next, the functional effect of semiconductor laser device 100 according to Embodiment 1 as well as the background of the present disclosure will be described.

A high-output semiconductor laser device for laser machining adopts a wide stripe structure having a large ridge width to prevent occurrence of COD. In a semiconductor laser device having a wide stripe structure, the transverse mode of the slow axis oscillates not only in the fundamental mode (zero-order mode) but also in a higher-order mode greater than or equal to first order mode The beam quality deteriorates due to degradation of BPP. Thus, it is important to create a structure in a semiconductor laser device, the structure causing the slow axis to oscillate in the fundamental transverse mode.

In order to cause the slow axis to oscillate in the fundamental transverse mode in a semiconductor laser device having a wide stripe structure having a large ridge width, it is sufficient that a threshold gain difference with respect to the fundamental mode be assigned to each higher-order mode.

Let m be defined as the order of the transverse mode, then gain $g_m$ in mth-order mode is given by integrating the product of light intensity $P_m(x)$ in mth-order mode and injected current density J(x) to the semiconductor laser device, and is represented by the following (Expression 2).

$$g_m = \int P_m(x) \times J(x) \cdot dx$$ (Expression 2)

In (Expression 2), x indicates a position in the slow axial direction (=the direction perpendicular to both the stacking direction of the semiconductor layer and the stripe direction of the ridge portion).

In general, current injection to a semiconductor laser device is performed by providing an electrode on the ridge portion. Thus, when the electrode on the ridge portion is divided in the x-axis direction to provide areas where J(x)=0, it is possible to decrease $g_m$ in accordance with (Expression 2). However, the optical distributions present in the transverse mode in the ridge portion do not have the same shape in any order modes. In other words, even when areas where J(x)=0 are provided, decrease in $g_m$ varies with each order mode.

Thus, in order to assign a threshold gain difference from the gain in the fundamental mode to a higher-order mode, if the electrode can be disposed so that gain $g_m$ (m>1) of the higher-order mode is significantly decreased without decreasing gain $g_0$ of the fundamental mode so much, in other words, if the electrode can be disposed so that $g_0 > g_m$ (m>1) at all times, even for a semiconductor laser device having a wide stripe structure, it is possible to cause fundamental transverse mode oscillation and to obtain an emission beam in a Gaussian shape preferred for laser machining.

Conventionally, in order to improve the transverse mode characteristics, a semiconductor laser device has been proposed (for instance, Japanese Unexamined Patent Application Publication No. 2004-221385), in which a control electrode driven independently from the main electrode is provided adjacent to the main electrode on the ridge portion to reduce disturbance in the optical output distribution due to spread of a driving current at ends of light emitting areas, and the beam shape is changed to a top hat shape (rectangular shape).

However, with this method, the beam shape becomes a top hat shape, and deviates from a Gaussian shape preferred for laser machining. Thus, $M^2$ value is increased, and the BPP degrades and the quality of machining deteriorates.

The technique of the present disclosure has been devised based on such knowledge, and the inventors of the present application have intensively studied a semiconductor laser device capable of achieving fundamental transverse mode oscillation with an excellent BPP without deviating the beam shape from a Gaussian shape. Hereinafter, the study will be described in detail.

Transverse mode number Nm, which can be waveguided in the ridge portion of a semiconductor laser device, can be calculated in accordance with Expression (1.33) described in Non-patent Literature (Semiconductor Laser by Kenichi Iga, applied physics series, Ohmsha, Ltd.) in which an oscillation wavelength and effective refractive indexes inside and outside the ridge portion are introduced into Maxwell's equations, and boundary conditions determined by the structure of the semiconductor layer are applied to Maxwell's equations.

In accordance with the expression, 12 transverse modes including the fundamental mode (zero-order mode) are allowed in the structure of semiconductor layer 110 of semiconductor laser device 100 in the embodiment. Specifically, the fundamental mode (fundamental transverse mode) which is zero-order mode, and 10 higher-order modes (higher-order transverse modes) which are first to 11th-order modes are observed.

Furthermore, the light intensity distribution of each mode can be calculated in accordance with Expression (1.10) to Expression (1.26) described in the above-mentioned Non-patent Literature.

Figure 2:
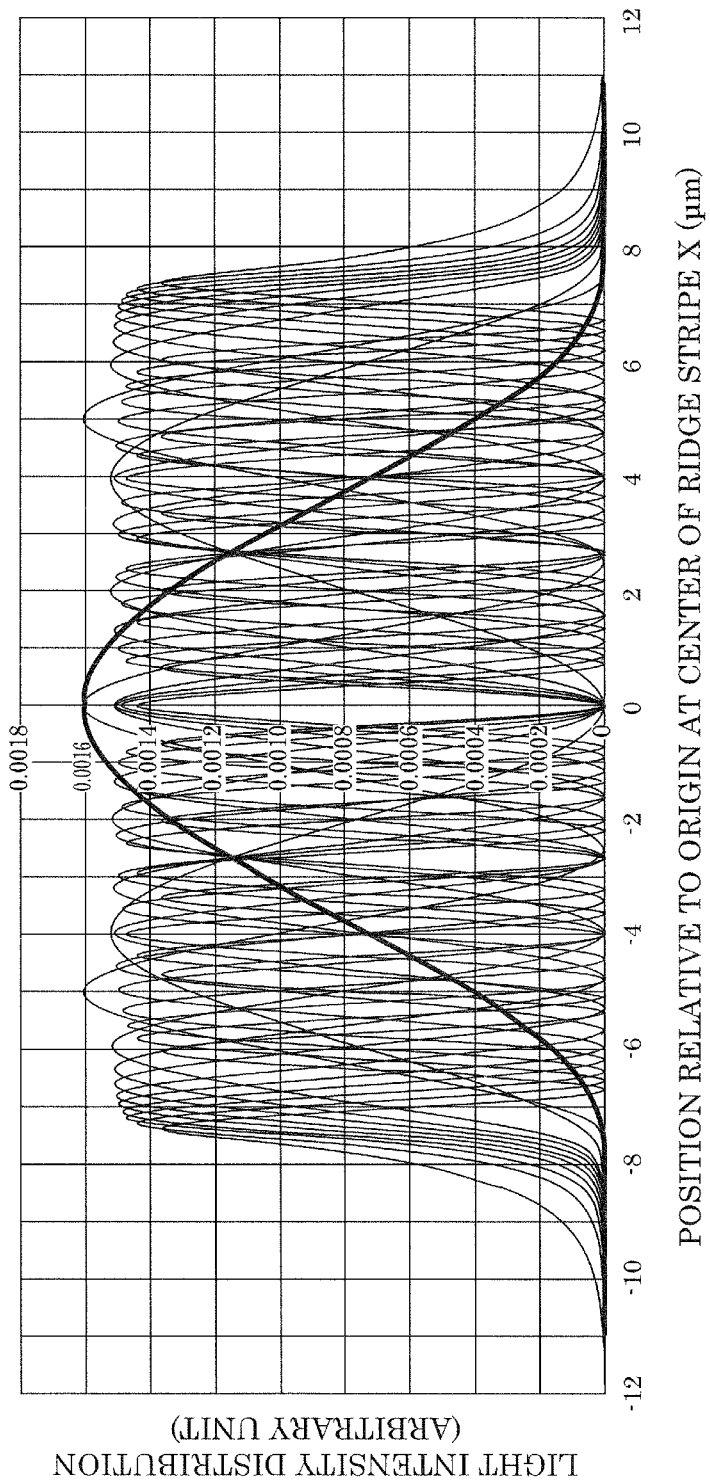
FIG. 2 is a graph illustrating a result of calculation of a light intensity distribution of the fundamental mode and higher-order (first to 11th) modes in a ridge portion and its surrounding in the semiconductor laser device according to Embodiment 1.

When the light intensity distribution of each mode is calculated in accordance with these expressions for the structure of semiconductor layer 110 of semiconductor laser device 100 in the embodiment, the result of calculation illustrated in FIG. 2 is obtained. In FIG. 2, a thick line indicates the light intensity distribution of the fundamental mode (zero-order mode) oscillation, and 11 thin lines indicate the light intensity distributions of the higher-order mode (first-order mode to 11th-order mode) oscillation.

Figure 3:
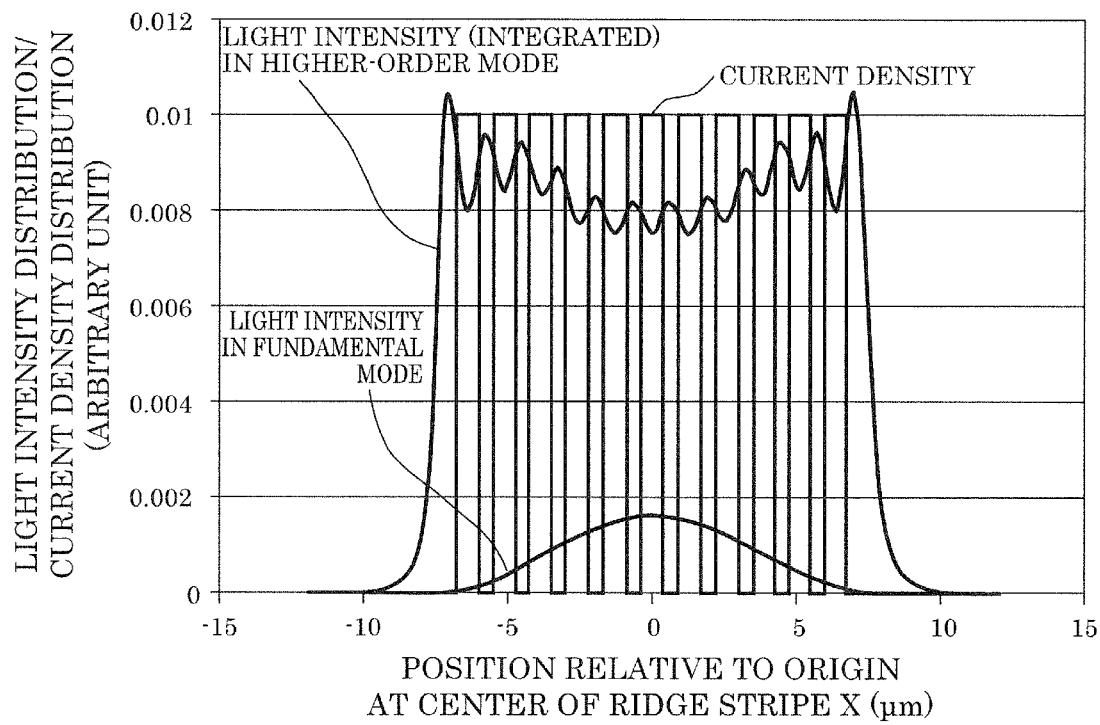
FIG. 3 is a graph illustrating a result of calculation of a light intensity distribution of the fundamental mode and a light intensity distribution in which the light intensities of the higher-order (first to 11th) modes are integrated, and an injected current density in the semiconductor laser device in the ridge portion and its surrounding in the semiconductor laser device according to Embodiment 1.

Among these, the fundamental-mode oscillation is excluded, and when 11 light intensity distributions of the higher-order mode oscillation are all integrated, the result illustrated in FIG. 3 is obtained. In FIG. 3, the light intensity distribution obtained by integrating all 11 light intensities of the higher-order mode oscillation is referred to as "light intensity (integrated) of higher-order mode". In FIG. 3, the light intensity distribution of the fundamental mode illustrated in FIG. 2 is illustrated again as "the light distribution of the fundamental mode" so as to overlap with the "light intensity (integrated) of higher-order mode".

As illustrated in FIG. 3, the light intensity distribution obtained by integrating the higher-order mode oscillation has waves, that is, local maximums and local minimums. Here, in order to reduce an overall gain given to the higher-order mode, and to have a gain difference in the higher-order mode from the gain in the fundamental mode, it is sufficient that no current be passed through each position at which the light intensity attains a local maximum, and a current be passed through each position at which the light intensity attains a local minimum. Current injection to a semiconductor laser device having a ridge portion is performed via an electrode formed on the ridge portion.

Thus, an electrode is disposed at each position at which the light intensity attains a local minimum, and conversely, an electrode is not disposed at each position at which the light intensity attains a local maximum, thereby making it possible to flow a current through each position at which the light intensity attains a local minimum, and to flow no current through each position at which the light intensity attains a local maximum.

When calculation is performed for semiconductor laser device 100 in the embodiment based on the above-mentioned Non-patent Literature, each position at which the light intensity attains a local minimum can be represented by the following (Expression 3) with the center of ridge portion 9 at origin (x=0). Each position at which the light intensity attains a local maximum is an intermediate position between local minimum points.

$$x = \pm 1.272 \times N (N=0,1,2,3,4,5) [\mu m] \quad \text{(Expression 3)}$$

As seen from (Expression 3), 11 local minimum points are located in the structure of semiconductor laser device 100 in the embodiment.

Thus, in the embodiment, p-side electrode 11 on ridge portion 9 is dividing into 11 sections at the positions (local maximum points) at which an integrated value of the light intensities of the higher-order mode oscillation has a local maximum. In other words, p-side electrode 11 is divided into multiple sections at all positions at which an integrated value of the light intensities of the higher-order mode oscillation has a local maximum so that p-side electrode 11 is not present at all positions at which an integrated value of the light intensities of the higher-order mode oscillation has a local maximum.

P-side electrode 11 divided includes 11 electrode sections 11a, and for each of all electrode sections 11a, the center of ridge portion 9 in the width direction is located at a position (local minimum point) at which an integrated value of the light intensities of the higher-order mode oscillation has a local minimum. In other words, each electrode section 11a is not present at a position at which an integrated value of the light intensities of the higher-order mode oscillation has a local maximum, but present at a position at which an integrated value of the light intensities of the higher-order mode oscillation has a local minimum. Specifically, the width of each of 11 electrode sections 11a is 0.7 µm, the width between adjacent electrode sections 11a is 0.5 µm, and the center of each electrode section 11a is the position represented by (Expression 3).

Consequently, no current is injected through a position at which an integrated value of the light intensities of the high-order transverse mode oscillation has a local maximum, but a current is injected through a position at which an integrated value of the light intensities of the high-order transverse mode oscillation has a local minimum. The current density distribution in this situation is illustrated as the "current density" of FIG. 3.

Figure 4:
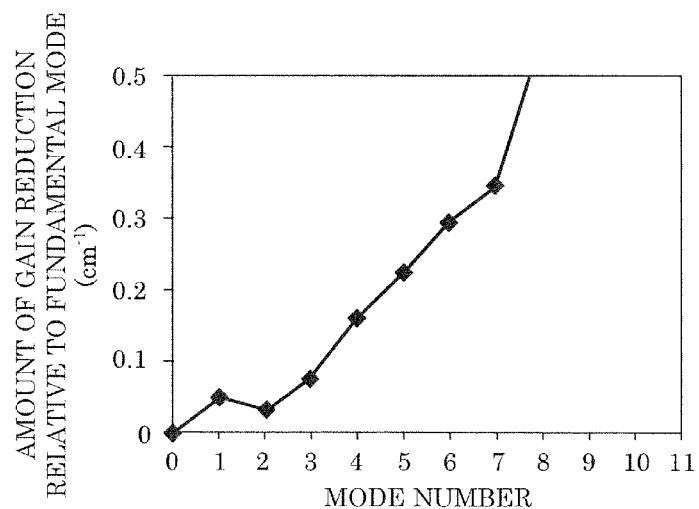
FIG. 4 is a graph illustrating the mode order dependence of gain difference in the semiconductor laser device according to Embodiment 1.

Furthermore, the gain of all modes from zero-order (fundamental) to 11th-order is calculated and determined in accordance with (Expression 2), the gain of all modes is subtracted from the gain of zero-order mode, and the result is calculated as the amount of decrease from the gain of zero-order mode. The result of calculation is illustrated in FIG. 4. In the calculation, the material gain of semiconductor laser device 100 in the embodiment is set to 1800 cm$^{-1}$, the vertical optical confinement factor is set to 4%, and the internal loss is set to 7 cm$^{-1}$. The injected current density is set to 1.5 kA/cm$^2$ which corresponds to the oscillation threshold current density of zero-order mode. It should be noted that for higher-order modes for 9th-order to 12th-order, the decrease in gain is large, and the gain difference from the gain of zero-order mode is greater than 0.5 cm$^{-1}$, thus the decrease is not illustrated in FIG. 4.

As seen from FIG. 4, the gains of the higher-order modes are all lower than the gain of zero-order (fundamental) mode. The gain increases as a current is injected in the semiconductor laser device, and oscillation starts in zero-order mode in which the gain is the largest. Afterward, further injected current is immediately converted into a laser beam, thus the current density is not increased. Therefore, the gain of each higher-order mode subsequent to first-order is not increased, and the higher-order mode does not oscillate. In this manner, even in a semiconductor laser device having a wide stripe structure, in which each higher-order mode is optically allowed, single transverse mode oscillation can be achieved, and a beam having a Gaussian shape preferred for material machining can be obtained.

In the embodiment, p-side electrode 11 is divided into 11 sections so that a current is injected through a position at which an integrated value of all the light intensities of the high-order transverse mode oscillation has a local minimum, and no current is injected through a position at which an integrated value of all the light intensities of the high-order transverse mode oscillation has a local maximum. However, as long as the gain difference between the fundamental mode and the higher-order modes is available, the number of division of p-side electrode 11 may be smaller than 11, and p-side electrode 11 may be divided into five sections or three sections, for instance. When the stripe width of ridge portion 9 or the effective refractive index is different, the same effect can be achieved by sequentially performing the calculation in accordance with the technique described above.

(Method of Manufacturing Semiconductor Laser Device)

Next, a method of manufacturing semiconductor laser device 100 according to the embodiment will be described using FIGS. 5A to 5D with reference to FIG. 1. FIGS. 5A to 5D are views for explaining a method of manufacturing semiconductor laser device 100 according to Embodiment 1, and particularly show schematic cross-sectional views when divided p-side electrode 11 is formed.

First, as illustrated in FIG. 1, on substrate 1 (semiconductor substrate), the following epitaxial layers are sequentially grown to form semiconductor layer 110, using, for instance, the Metalorganic Chemical Vapor Deposition (MOCVD): first cladding layer 2, first guide layer 3, active layer 4, second guide layer 5, electron overflow reduction layer 6, second cladding layer 7, and contact layer 8.

Specifically, first cladding layer 2 made of n-type $Al_{0.03}GaN$ is grown 2 µm thick on substrate 1 which is an n-type hexagonal GaN substrate and has a major surface of (0001) surface. On top of that, first guide layer 3 made of i-GaN is grown 0.1 µm thick. On top of that, active layer 4 in a quantum well structure is grown, which includes two cycles of a barrier layer made of $In_{0.02}GaN$ and a quantum well layer made of $In_{0.07}GaN$. The thickness of the barrier layer is, for instance, 20 nm, and the thickness of the quantum well layer is, for instance, 7 nm. Although the barrier layer is formed between quantum well layers, the barrier layer may be formed above and below the quantum well layers not only between the quantum well layers.

Subsequently, second guide layer 5 made of i-GaN is grown 0.1 µm thick on active layer 4. On top of that, carrier overflow reduction layer (OFS layer) 6 made of $A_{0.35}GaN$ is grown 5 nm thick. On top of that, second cladding layer 7 is formed, which is a strained layer superlattice having a thickness of 0.48 µm and formed by repeating 160 cycles of a $p-A_{0.06}GaN$ layer (1.5 nm) and a GaN layer (1.5 nm). On top of that, contact layer 8 made of p-GaN is grown 0.05 µm thick.

Subsequently, semiconductor layer 110 is processed into a ridge stripe structure by formed ridge portion 9 thereon. In this case, although not illustrated, first, an insulating film made of $SiO_2$ having a thickness of 0.3 µm is formed on contact layer 8, for instance, by a heat CVD method. Furthermore, a stripe shape having a width of 15 µm is left as part of the insulating film, and other areas are etched by a photolithographic method and an etching method using hydrofluoric acid. In this process, in consideration of forming an end face of the laser utilizing the natural cleavage plane (m-plane) of a hexagonal nitride semiconductor, the direction of stripe is set to parallel to m-axis direction of the hexagonal GaN. Subsequently, the upper portion of semiconductor layer 110 is etched with a depth of 0.4 µm by Inductively Coupled Plasma (ICP) etching method using the insulating film as a mask, and the upper portions of contact layer 8 and second cladding layer 7 are processed, thereby forming ridge portion 9 as illustrated in FIG. 1. Subsequently, the insulating film is removed using hydrofluoric acid. Then insulating film 10 made of $SiO_2$ having a thickness of 200 nm is formed again by a heat CVD method over the entire surface including ridge portion 9 on exposed second cladding layer 7.

Subsequently, divided p-side electrode 11 is formed on ridge portion 9. A method of forming p-side electrode 11 will be described with reference to FIGS. 5A to 5D.

Figure 5A:
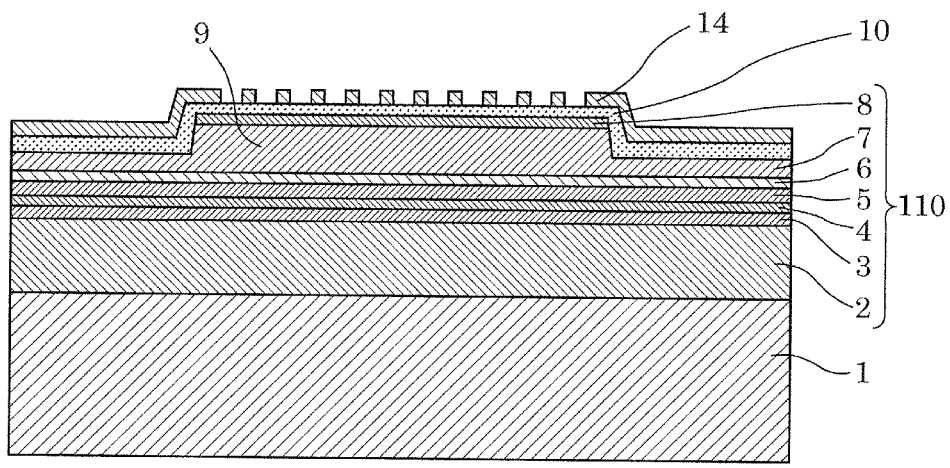
FIG. 5A is a cross-sectional view illustrating a resist pattern formation scheme in a method of manufacturing the semiconductor laser device according to Embodiment 1.

First, as illustrated in FIG. 5A, resist pattern 14 having 11 openings is formed, each having a width of 0.7 µm and extending in the stripe direction of ridge portion 9, in the upper surface of insulating film 10 over ridge portion 9 by a lithography method. The openings are formed at an interval of 0.5 µm, for instance. In this process, the centers of the openings of resist pattern 14 are the positions indicated by (Expression 3) mentioned above, and the center of resist pattern 14, which separates two adjacent openings, is the above-described position at which an integrated value of the light intensities of the higher-order mode oscillation has a local maximum. It should be noted that the openings of resist pattern 14 correspond to electrode sections 11a of p-side electrode 11, and are formed at the positions at which an integrated value of the light intensities of the higher-order mode oscillation has a local minimum.

Figure 5B:
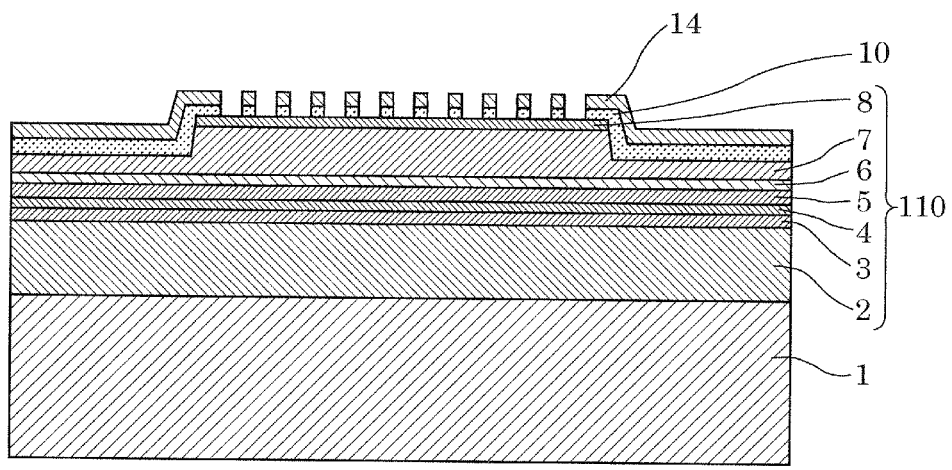
FIG. 5B is a cross-sectional view illustrating an insulating film etching scheme in the method of manufacturing the semiconductor laser device according to Embodiment 1.

Subsequently, as illustrated in FIG. 5B, insulating film 10 is etched, for instance, by a reactive ion etching (RIE) using trifluoromethane (CHF3) gas using resist pattern 14 as a mask, thereby exposing contact layer 8 from the upper surface of ridge portion 9.

Figure 5C:
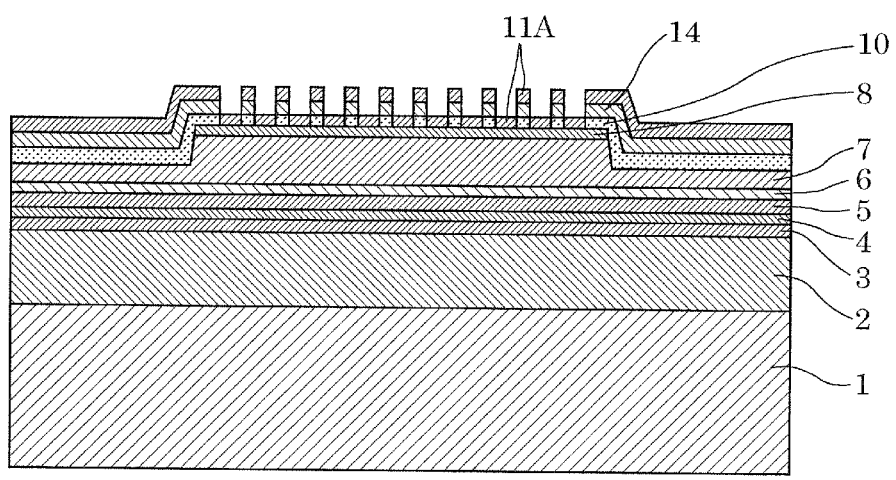
FIG. 5C is a cross-sectional view illustrating a metal layered film formation scheme in the method of manufacturing the semiconductor laser device according to Embodiment 1.

Subsequently, as illustrated in FIG. 5C, metal layered film 11A is formed in a two-layer structure including, for instance, palladium (Pd) having a thickness of 40 nm and platinum (Pt) having a thickness of 35 nm on at least contact layer 8 exposed from the upper surface of ridge portion 9 for instance, by an electron beam (EB) vapor deposition method.

Figure 5D:
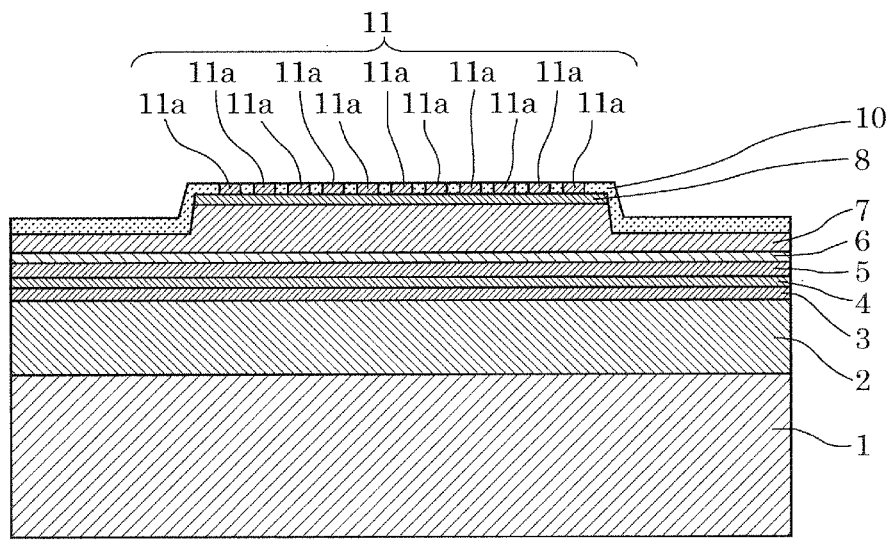
FIG. 5D is a cross-sectional view illustrating a resist pattern removal scheme in the method of manufacturing the semiconductor laser device according to Embodiment 1.

Subsequently, as illustrated in FIG. 5D, metal layered film 11A in the area other than the portion over ridge portion 9 is removed by a liftoff method for removing resist pattern 14, thereby forming p-side electrode 11 including 11 electrode sections 11a.

In this manner, p-side electrode 11 divided into 11 sections is formed on ridge portion 9.

Subsequently, as illustrated in FIG. 1, pad electrode 12 is formed so as to cover insulating film 10 and p-side electrode 11 by a lithography method and a liftoff method. In pad electrode 12, for instance, the plane length in the direction parallel to the stripe direction of ridge portion 9 is 900 µm, and the plane length in the direction perpendicular to the stripe direction of ridge portion 9 is 150 µm. Pad electrode 12 is a metal layered film including titanium (Ti) having a thickness of 100 nm, platinum (Pt) having a thickness of 35 nm, and gold (Au) having a thickness of 1500 nm.

Subsequently, for a semiconductor light emitting device in a wafer state with up to pad electrode 12 formed, the back surface of substrate 1 is polished with a diamond slurry until the thickness of substrate 1 is reduced to approximately 100 µm.

Subsequently, n-side electrode 13 is formed, which includes Ti having a thickness of 5 nm, Pt having a thickness of 10 nm, and Au having a thickness of 1000 nm, on the back surface (the surface on the opposite side of the surface on which semiconductor layer 110 is formed) of substrate 1, for instance, by an EB vapor deposition method.

Subsequently, the semiconductor light emitting device in a wafer state is cleaved (primarily cleaved) along m-plane so that the length in m-axis direction is 1000µ, for instance. Subsequently, for instance, a front coating film is formed as an end face coating film at a cleaved face (front end face) through which a laser beam is emitted, and a rear coating film is formed as an end face coating film at a cleaved face (rear end face) one the opposite side using an electron cyclotron resonance (ECR) sputtering method.

Subsequently, the primarily cleaved semiconductor light emitting device is cleaved (secondarily cleaved) so that the length in x-axis direction is 200µ, for instance, and thus semiconductor laser device 100 can be completed as a laser chip.

(Summary)

In semiconductor laser device 100 according to the embodiment described above includes: first cladding layer 2 (first semiconductor layer) of first conductivity type, active layer 4 (light emitting layer) formed above first cladding layer 2, cladding layer 7 (second semiconductor layer) of second conductivity type formed above active layer 4, and p-side electrode 11 formed above ridge portion 9 formed in second cladding layer 7. P-side electrode 11 is then divided into multiple sections at the positions at which an integrated value of the light intensities of the higher-order mode oscillation has a local maximum. In other words, p-side electrode 11 is not present at a position at which an integrated value of the light intensities of the higher-order mode oscillation has a local maximum.

This structure makes it possible to decrease the ratio of the current which flows through a portion where higher-order mode oscillation is integrated and the light intensity is high. In other words, when all the current is constant, it is possible to decrease the ratio of the current which flows through a portion where higher-order mode oscillation is integrated and the light intensity is high, and to increase the ratio of the current which flows through a portion where higher-order mode oscillation is integrated and the light intensity is low. Thus, the gain of the higher-order mode can be effectively decreased in accordance with (Expression 2).

Also, in p-side electrode 11 having such a configuration, a portion where no current flows (a portion in which p-side electrode 11 is not present) occurs, and thus the gain of the fundamental mode is also decreased. However, p-side electrode 11 is disposed so that a portion where higher-order mode oscillation is integrated and the light intensity is high, is selectively decreased, and the decrease in the gain of the fundamental mode is smaller than the gain of each higher-order mode. Thus, the gain of the fundamental mode is relatively larger than the gain of the higher-order mode, and the fundamental mode oscillation is obtained.

Consequently, a semiconductor laser device can be implemented, which has high beam quality and high output and is capable of achieving fundamental transverse mode oscillation with an excellent BPP even in a wide stripe structure.

Furthermore, in semiconductor laser device 100 according to the embodiment, divided p-side electrode 11 includes multiple electrode sections 11a which extend in the stripe direction of ridge portion 9. The center of at least one of multiple electrode sections 11a in a direction perpendicular to the stripe direction of ridge portion 9 is located at a position at which an integrated value of the light intensities of the higher-order mode oscillation has a local minimum.

This structure makes it possible to most effectively increase the ratio of the current which flows through a portion where higher-order mode oscillation is integrated and the light intensity is the lowest. In other words, when all the current is constant, it is possible to effectively decrease the ratio of the current which flows through a portion where higher-order mode oscillation is integrated and the light intensity is high. This enables the gain of higher-order mode to be effectively decreased, and thus stable fundamental transverse mode oscillation can be achieved.

In semiconductor laser device 100 according to the embodiment, p-side electrode 11 is divided into multiple sections at all positions at which an integrated value of the light intensities of the higher-order mode oscillation has a local maximum.

This structure allows a current necessary to obtain a high gain in a higher-order mode to be 0 in all areas where the light intensity of the higher-order mode oscillation has a local maximum. This enables the gain of the higher-order mode to be effectively decreased, and a gain difference in the higher-order mode from the gain in the fundamental mode can be the largest. Thus, the fundamental transverse mode is more likely to be selected, and the fundamental transverse mode oscillation can be easily achieved.

In addition, in semiconductor laser device 100 according to the embodiment, the center of each of all multiple electrode sections 11a in a direction perpendicular to the stripe direction of ridge portion 9 is located at a position at which an integrated value of the light intensities of the higher-order mode oscillation has a local minimum.

This structure makes it possible to most effectively increase the ratio of the current which flows through a portion where higher-order mode oscillation is integrated and the light intensity is the lowest. In other words, when all the current is constant, the ratio of the current is decreased most, which flows through a portion where higher-order mode oscillation is integrated and the light intensity is high. This enables the gain of higher-order mode to be most effectively decreased, and thus more stable fundamental transverse mode oscillation can be achieved.

Embodiment 2

Figure 6:
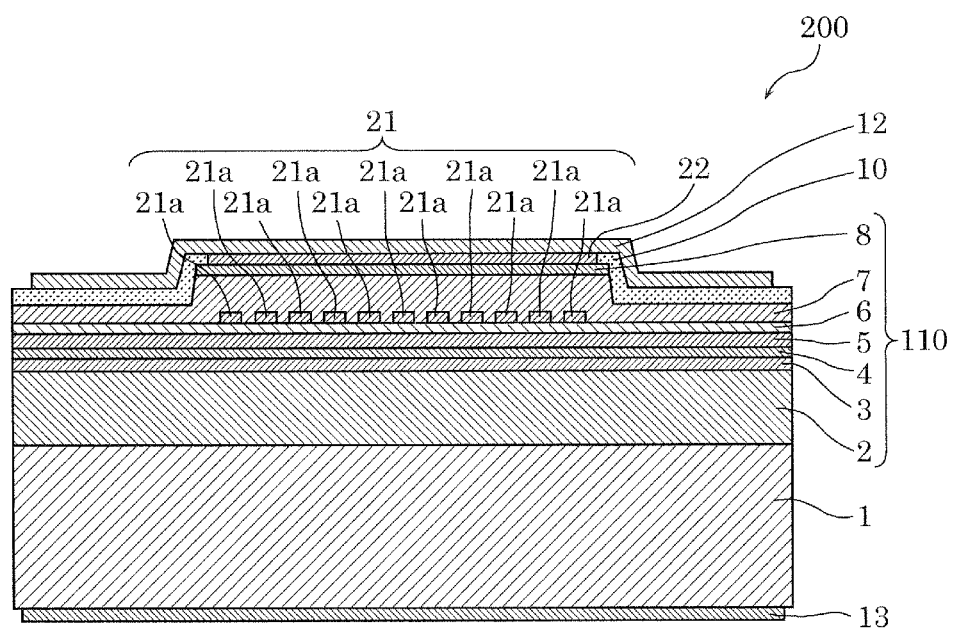
FIG. 6 is a cross-sectional view of a semiconductor laser device according to Embodiment 2.

Next, semiconductor laser device 200 according to Embodiment 2 will be described with reference to FIG. 6. FIG. 6 is a cross-sectional view of semiconductor laser device 200 according to Embodiment 2.

In semiconductor laser device 100 in Embodiment 1 illustrated in FIG. 1, the gain difference between each higher-order mode and the fundamental mode is given by dividing p-side electrode 11. However, in semiconductor laser device 200 in the embodiment, the gain difference between each higher-order mode and the fundamental mode is given by dividing a current block layer formed inside the semiconductor layer.

Specifically, as illustrated in FIG. 6, semiconductor laser device 200 in the embodiment includes current block layer 21 embedded in semiconductor layer 110. Current block layer 21 is formed between active layer 4 and p-side electrode 22.

Current block layer 21 is divided into multiple current block sections 21a which each extend in the stripe direction of ridge portion 9. Current block layer 21 is divided at multiple positions at which an integrated value of the light intensities of the higher-order mode oscillation has a local minimum. In the embodiment, current block layer 21 is divided at all positions at which an integrated value of the light intensities of the higher-order mode oscillation has a local minimum. Specifically, current block layer 21 is divided into 11 sections, and includes 11 current block sections 21a.

Multiple current block sections 21a are each present at a position at which an integrated value of the light intensities of the higher-order mode oscillation has a local maximum. In the embodiment, all of multiple current block sections 21a are located at positions at which an integrated value of the light intensities of the higher-order mode oscillation has a local maximum.

Although current block layer 21 has the same composition as that of second cladding layer 7, current block layer 21 has an insulating property and a high electrical resistance. As a consequence, current block layer 21 has characteristics such that it is optically the same as second cladding layer 7, thus has no effect on a light distribution, and a current conductively flows through only the area where current block layer 21 (current block sections 21a) is not present.

In semiconductor laser device 200 in the embodiment, in current block layer 21, a gain is generated only in the area through which the current flows, thus the same effect can be obtained as when p-side electrode 11 is divided as in Embodiment 1.

In the embodiment, p-side electrode 22 is uniformly formed as a single film without being divided. Thus, the contact area between contact layer 8 and p-side electrode 22 can be increased, as compared with Embodiment 1, thus the contact resistance can be reduced.

Figure 7A:
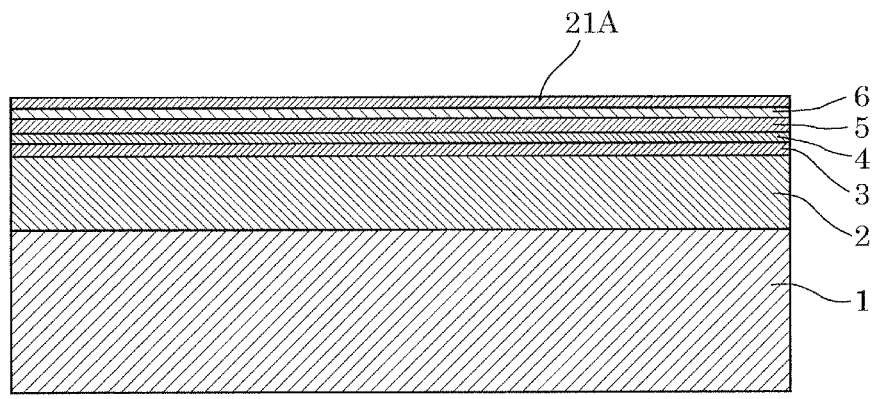
FIG. 7A is a cross-sectional view illustrating up to an undoped insulating layer formation scheme in a method of manufacturing the semiconductor laser device according to Embodiment 2.
Figure 7B:
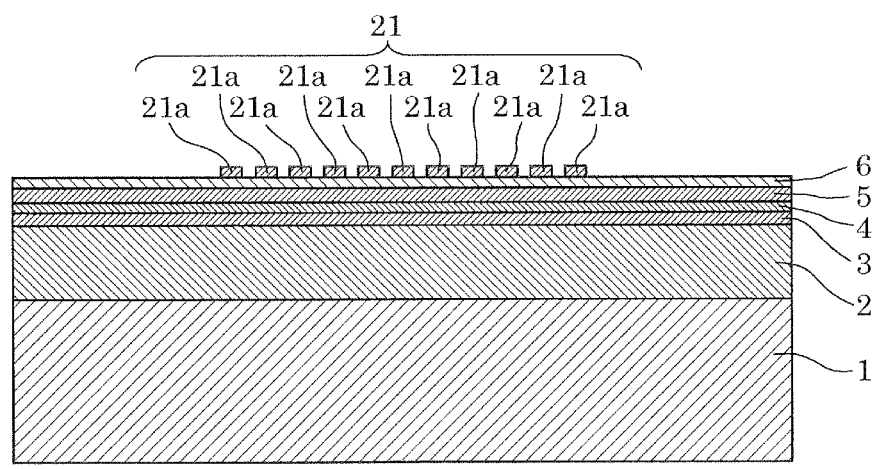
FIG. 7B is a cross-sectional view illustrating an undoped insulating layer division scheme in the method of manufacturing the semiconductor laser device according to Embodiment 2.
Figure 7C:
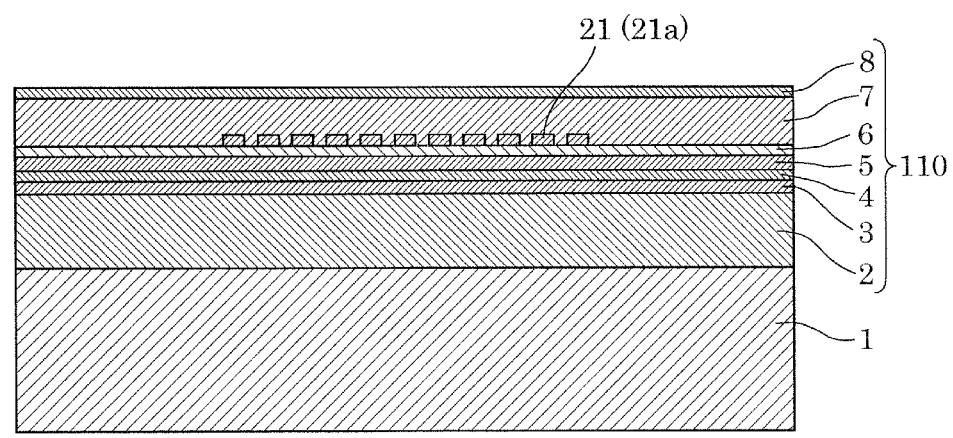
FIG. 7C is a cross-sectional view illustrating a cladding layer formation scheme and a contact layer formation scheme in the method of manufacturing the semiconductor laser device according to Embodiment 2.

Next, a method of manufacturing semiconductor laser device 200 according to the embodiment will be described with reference to FIGS. 7A to 7C. FIGS. 7A to 7C are cross-sectional views illustrating the method of manufacturing semiconductor laser device 200 according to Embodiment 2.

First, as illustrated in FIG. 7A, on substrate 1 (semiconductor substrate), the following epitaxial layers are sequentially grown using, for instance, the MOCVD method: first cladding layer 2, first guide layer 3, active layer 4, second guide layer 5, electron overflow reduction layer 6, and current block layer 21.

Specifically, first cladding layer 2 made of n-type $Al_{0.03}GaN$ is grown 2 μm thick on substrate 1 which is a GaN substrate. On top of that, first guide layer 3 made of i-GaN is grown 0.1 μm thick. On top of that, active layer 4 in a quantum well structure is grown, which includes two cycles of a barrier layer made of $In_{0.02}GaN$ and a quantum well layer made of $In_{0.07}GaN$. The thickness of the barrier layer is, for instance, 20 nm, and the thickness of the quantum well layer is, for instance, 7 nm. Although the barrier layer is formed between quantum well layers, the barrier layer may be formed above and below the quantum well layers not only between the quantum well layers.

Subsequently, second guide layer 5 made of i-GaN is grown 0.1 μm thick on active layer 4. On top of that, carrier overflow reduction layer (OFS layer) 6 made of $Al_{0.35}GaN$ is grown 5 nm thick. On top of that, undoped insulating layer 21A is formed, which is a strained layer superlattice having a thickness of 0.1 μm and formed by repeating 160 cycles of a p-AlGaN layer (1.5 nm) and a GaN layer (1.5 nm). In this process, to improve the insulating property of undoped insulating layer 21A, ions such as Fe, Ar, N, F, and B may be injected.

Subsequently, as illustrated in FIG. 7B, divided current block layer 21 is formed by processing undoped insulating layer 21A. Specifically, current block layer 21 including multiple current block sections 21a is formed by partially removing undoped insulating layer 21A using a photolithographic method and a dry etching method.

Subsequently, as illustrated in FIG. 7C, second cladding layer 7 is formed so as to cover carrier overflow reduction layer along with current block layer 21, cladding layer 7 being a strained layer superlattice having a thickness of 0.38 μm and formed by repeating 160 cycles of a p-AlGaN layer (1.5 nm) and a GaN layer (1.5 nm). On top of that, contact layer 8 made of p-GaN is grown 0.05 μm thick. Current block layer 21 is embedded in semiconductor layer 110 by this process.

Although not illustrated, subsequently, similarly to Embodiment 1, ridge portion 9 is formed, then p-side electrode 22 and pad electrode 12 are formed, the thickness of substrate 1 is further reduced to form n-side electrode 13, then semiconductor laser device 200 can be completed as a laser chip by primarily cleaving and secondarily cleaving the semiconductor light emitting device. It should be noted that a process of dividing p-side electrode 22 is not performed.

In semiconductor laser device 200 according to the embodiment described above includes: first cladding layer 2 (first semiconductor layer) of first conductivity type, active layer 4 (light emitting layer) formed above first cladding layer 2, cladding layer 7 (second semiconductor layer) of second conductivity type formed above active layer 4, p-side electrode 22 formed above ridge portion 9 formed in second cladding layer 7, and current block layer 21 formed between active layer 4 and p-side electrode 22. Current block layer 21 is divided into multiple current block sections 21a which each extend in the stripe direction of ridge portion 9, and multiple current block sections 21a are each present at a position at which an integrated value of the light intensities of the higher-order mode oscillation has a local maximum.

This structure makes it possible to decrease the ratio of the current which flows through a portion where higher-order mode oscillation is integrated and the light intensity is high. In other words, when all the current is constant, it is possible to decrease the ratio of the current which flows through a portion where higher-order mode oscillation is integrated and the light intensity is high, and to increase the ratio of the current which flows through a portion where higher-order mode oscillation is integrated and the light intensity is low. Thus, the gain of the higher-order mode can be effectively decreased in accordance with (Expression 2).

Also, in current block layer 21 having such a configuration, a portion where no current flows (a portion in which current block layer 21 is located) occurs, and thus the gain of the fundamental mode is also decreased. However, current block layer 21 is disposed so that a portion where higher-order mode oscillation is integrated and the light intensity is high, is selectively decreased, and the decrease in the gain of the fundamental mode is smaller than the gain of each higher-order mode. Thus, the gain of the fundamental mode is relatively larger than the gain of the higher-order mode, and the fundamental mode oscillation is obtained.

Consequently, in the embodiment, a semiconductor laser device can be implemented, which has high beam quality and high output and is capable of achieving fundamental transverse mode oscillation with an excellent BPP even in a wide stripe structure.

Furthermore, in semiconductor laser device 200 according to the embodiment, current block layer 21 is divided at multiple positions at which an integrated value of the light intensities of the higher-order mode oscillation has a local minimum.

This structure makes it possible to most effectively increase the ratio of the current which flows through a portion where higher-order mode oscillation is integrated and the light intensity is the lowest. In other words, when all the current is constant, it is possible to effectively decrease the ratio of the current which flows through a portion where higher-order mode oscillation is integrated and the light intensity is high. This enables the gain of higher-order mode to be effectively decreased, and thus stable fundamental transverse mode oscillation can be achieved.

Also, in semiconductor laser device 200 according to the embodiment, all of multiple current block sections 21a are located at positions at which an integrated value of the light intensities of the higher-order mode oscillation has a local maximum.

This structure allows a current necessary to obtain a high gain in a higher-order mode to be 0 in all areas where the light intensity of the higher-order mode oscillation has a local maximum. This enables the gain of the higher-order mode to be effectively decreased, and a gain difference in the higher-order mode from the gain in the fundamental mode can be the largest. Thus, the fundamental transverse mode is likely to be selected, and the fundamental transverse mode oscillation can be easily achieved.

Furthermore, in semiconductor laser device 200 according to the embodiment, current block layer 21 is divided at all positions at which an integrated value of the light intensities of the higher-order mode oscillation has a local minimum.

This structure makes it possible to most effectively increase the ratio of the current which flows through a portion where higher-order mode oscillation is integrated and the light intensity is the lowest. In other words, when all the current is constant, the ratio of the current is decreased most, which flows through a portion where higher-order mode oscillation is integrated and the light intensity is high. This enables the gain of higher-order mode to be most effectively decreased, and thus more stable fundamental transverse mode oscillation can be achieved.

In the embodiment, current block layer 21 is divided into 11 sections so that a current is injected through a position at which an integrated value of all the light intensities of the high-order transverse mode oscillation has a local minimum, and no current is injected through a position at which an integrated value of all the light intensities of the high-order transverse mode oscillation has a local maximum. However, as long as the gain difference between the fundamental mode and the higher-order modes is available, the number of division of p-side electrode 11 may be smaller than 11, and p-side electrode 11 may be divided into five sections or three sections, for instance.

(Modification)

Although the semiconductor laser device according to the present disclosure has been described above based on the embodiments, the present disclosure is not limited to the above-described embodiments.

For instance, in the embodiments, the GaN-based semiconductor laser device, which uses GaN as the material and has a wavelength of 405 nm band, has been described, but this is not always the case. The present disclosure may be applied to a semiconductor laser device having a different wavelength band, or to a III-V based semiconductor laser device made of another III-V group semiconductor material, such as GaAs or InP. The present disclosure may be applied to a II-VI based semiconductor laser device made of a II-VI group semiconductor material, such as ZeSe.

In addition, an embodiment obtained by applying various modifications that occur to those skilled in the art to the embodiments, and an embodiment implemented by arbitrarily combining the components and functions in the embodiments in a scope not departing from the essence of the present disclosure are also included in the present disclosure.

INDUSTRIAL APPLICABILITY

The semiconductor laser device according to the present disclosure can achieve both high beam quality and high power, thus is useful as a light source for a laser beam machining device for DDL.

The invention claimed is:
1. A semiconductor laser device, comprising:
a first semiconductor layer of a first conductivity type;
a light emitting layer formed above the first semiconductor layer;
a second semiconductor layer of a second conductivity type formed above the light emitting layer; and an electrode formed above a ridge portion formed in the second semiconductor layer, wherein an effective refractive index inside the ridge portion is constant, and wherein the electrode is divided at positions at which an integrated value of light intensities of higher-order mode oscillation has a local maximum.

2. The semiconductor laser device according to claim 1, wherein the electrode divided includes a plurality of electrode sections that extend in a stripe direction of the ridge portion, and a center of at least one of the plurality of electrode sections in a direction perpendicular to the stripe direction of the ridge portion is located at a position at which the integrated value of light intensities of higher-order mode oscillation has a local minimum.

3. The semiconductor laser device according to claim 1, wherein the electrode is divided at positions at which the integrated value of light intensities of higher-order mode oscillation has a local maximum, the positions including any position at which the integrated value has a corresponding local maximum.

4. The semiconductor laser device according to claim 3, wherein the electrode divided includes a plurality of electrode sections that extend in a stripe direction of the ridge portion, and a center of each of the plurality of electrode sections in a direction perpendicular to the stripe direction is located at a position at which the integrated value of light intensities of higher-order mode oscillation has a local minimum.

5. A semiconductor laser device comprising:
a first semiconductor layer of a first conductivity type;
a light emitting layer formed above the first semiconductor layer;
a second semiconductor layer of a second conductivity type formed above the light emitting layer;
an electrode formed above a ridge portion formed in the second semiconductor layer, wherein an effective refractive index inside the ridge portion is constant; and a current block layer formed between the light emitting layer and the electrode, wherein the current block layer is divided into a plurality of current block sections that extend in a stripe direction of the ridge portion, and the plurality of current block sections are located at positions at which an integrated value of light intensities of higher-order mode oscillation has a local maximum.

6. The semiconductor laser device according to claim 5, wherein the current block layer is divided at positions at which the integrated value of light intensities of higher-order mode oscillation has a local minimum.

7. The semiconductor laser device according to claim 5, wherein each of the plurality of current block sections is located at a position at which the integrated value of light intensities of higher-order mode oscillation has a local maximum.

8. The semiconductor laser device according to claim 7, wherein the current block layer is divided at positions at which the integrated value of light intensities of higher-order mode oscillation has a local minimum, the positions including any position at which the integrated value has a corresponding local minimum.

9. A semiconductor laser device comprising:
a first semiconductor layer of a first conductivity type;
a light emitting layer formed above the first semiconductor layer;
a second semiconductor layer of a second conductivity type formed above the light emitting layer; and
an electrode formed above a ridge portion formed in the second semiconductor layer, wherein an effective refractive index inside the ridge portion is constant, and
wherein a current, which flows from the electrode into the light emitting layer, has a small value at a position at which an integrated value of light intensities of higher-order mode oscillation has a local maximum, and has a large value at a position at which the integrated value has a local minimum.

* * * * *